US009264526B1

(12) United States Patent
Burns

(10) Patent No.: US 9,264,526 B1
(45) Date of Patent: Feb. 16, 2016

(54) SOUND-AMPLIFYING CELL PHONE CASE

(71) Applicant: Charles Burns, Rio Oso, CA (US)

(72) Inventor: Charles Burns, Rio Oso, CA (US)

( * ) Notice: Subject to any disclaimer, the term of this patent is extended or adjusted under 35 U.S.C. 154(b) by 0 days.

(21) Appl. No.: 14/618,063

(22) Filed: Feb. 10, 2015

(51) Int. Cl.
| H04M 1/00 | (2006.01) |
| H04M 1/03 | (2006.01) |
| H05K 5/00 | (2006.01) |
| H04B 1/3888 | (2015.01) |
| G06F 1/16 | (2006.01) |
| H04M 1/04 | (2006.01) |

(52) U.S. Cl.
CPC ............ H04M 1/035 (2013.01); G06F 1/1688 (2013.01); H04B 1/3888 (2013.01); H04M 1/04 (2013.01); H05K 5/0013 (2013.01); H05K 5/0086 (2013.01)

(58) Field of Classification Search
CPC ...... H04M 1/035; H04M 1/04; H04B 1/3888; G06F 1/1688; H05K 5/0013; H05K 5/0086
USPC ...................................................... 455/575.8
See application file for complete search history.

(56) References Cited

U.S. PATENT DOCUMENTS

| 6,530,570 | B2 | 3/2003 | Ku | |
| D676,851 | S | 2/2013 | Finnegan | |
| 8,544,644 | B2 | 10/2013 | Meehan | |
| D709,510 | S | * 7/2014 | Soare | ............................ D14/440 |
| 8,777,002 | B2 | 7/2014 | Lonsdale, II | |
| 9,008,736 | B2 | * 4/2015 | Hu | ........................ G06F 1/1628 455/575.1 |
| 2007/0268247 | A1 | 11/2007 | Quatro | |
| 2012/0193496 | A1 | 8/2012 | Li | |
| 2012/0228169 | A1 | 9/2012 | Huang | |
| 2013/0070948 | A1 | 3/2013 | Lee | |
| 2014/0069736 | A1 | * 3/2014 | Freshman | ........... H04M 1/0202 181/182 |
| 2014/0138265 | A1 | * 5/2014 | Bong | ..................... A45C 11/00 206/37 |

* cited by examiner

Primary Examiner — Allahyar Kasraian
Assistant Examiner — Farid Seyedvosoghi
(74) Attorney, Agent, or Firm — Kyle A. Fletcher, Esq.

(57) ABSTRACT

The sound amplifying cell case addresses is a case for cellular phones or tablets that provides handholds for holding the cellular phone or tablet and protects the side controls to prevent accidental contact. The sound amplifying cell case comprises a plurality of corner brackets.

17 Claims, 5 Drawing Sheets

SOUND-AMPLIFYING CELL PHONE CASE

CROSS REFERENCES TO RELATED APPLICATIONS

Not Applicable

STATEMENT REGARDING FEDERALLY SPONSORED RESEARCH

Not Applicable

REFERENCE TO APPENDIX

Not Applicable

BACKGROUND OF THE INVENTION

The present invention relates to the field of cellular phone accessories, more specifically, an accessory configured for use as a cellular phone case.

Games that can be played on cellular phones or tablets are popular. One feature of playing games on cellular phones or tablets is that they can react to the controls on the side of the cellular phones or tablets on which they are played. This puts players of a game that are playing on cellular phones and smaller tablets at a disadvantage in that it is relatively easy to accidently touch these side controls which can produce unfortunate results in a game.

SUMMARY OF INVENTION

The sound amplifying cell case addresses this problem by providing a case for cellular phones or tablets that provides handholds for holding the cellular phone or tablet and protects the side controls to prevent accidental contact. The sound amplifying cell case comprises a plurality of corner brackets.

These together with additional objects, features and advantages of the sound amplifying cell case will be readily apparent to those of ordinary skill in the art upon reading the following detailed description of the presently preferred, but nonetheless illustrative, embodiments when taken in conjunction with the accompanying drawings.

In this respect, before explaining the current embodiments of the sound amplifying cell case in detail, it is to be understood that the sound amplifying cell case is not limited in its applications to the details of construction and arrangements of the components set forth in the following description or illustration. Those skilled in the art will appreciate that the concept of this disclosure may be readily utilized as a basis for the design of other structures, methods, and systems for carrying out the several purposes of the sound amplifying cell case.

It is therefore important that the claims be regarded as including such equivalent construction insofar as they do not depart from the spirit and scope of the sound amplifying cell case. It is also to be understood that the phraseology and terminology employed herein are for purposes of description and should not be regarded as limiting.

BRIEF DESCRIPTION OF DRAWINGS

The accompanying drawings, which are included to provide a further understanding of the invention are incorporated in and constitute a part of this specification, illustrate an embodiment of the invention and together with the description serve to explain the principles of the invention. They are meant to be exemplary illustrations provided to enable persons skilled in the art to practice the disclosure and are not intended to limit the scope of the appended claims.

DETAILED DESCRIPTION OF THE EMBODIMENT

The following detailed description is merely exemplary in nature and is not intended to limit the described embodiments of the application and uses of the described embodiments. As used herein, the word "exemplary" or "illustrative" means "serving as an example, instance, or illustration." Any implementation described herein as "exemplary" or "illustrative" is not necessarily to be construed as preferred or advantageous over other implementations. All of the implementations described below are exemplary implementations provided to enable persons skilled in the art to practice the disclosure and are not intended to limit the scope of the appended claims. Furthermore, there is no intention to be bound by any expressed or implied theory presented in the preceding technical field, background, brief summary or the following detailed description.

Figure 1:
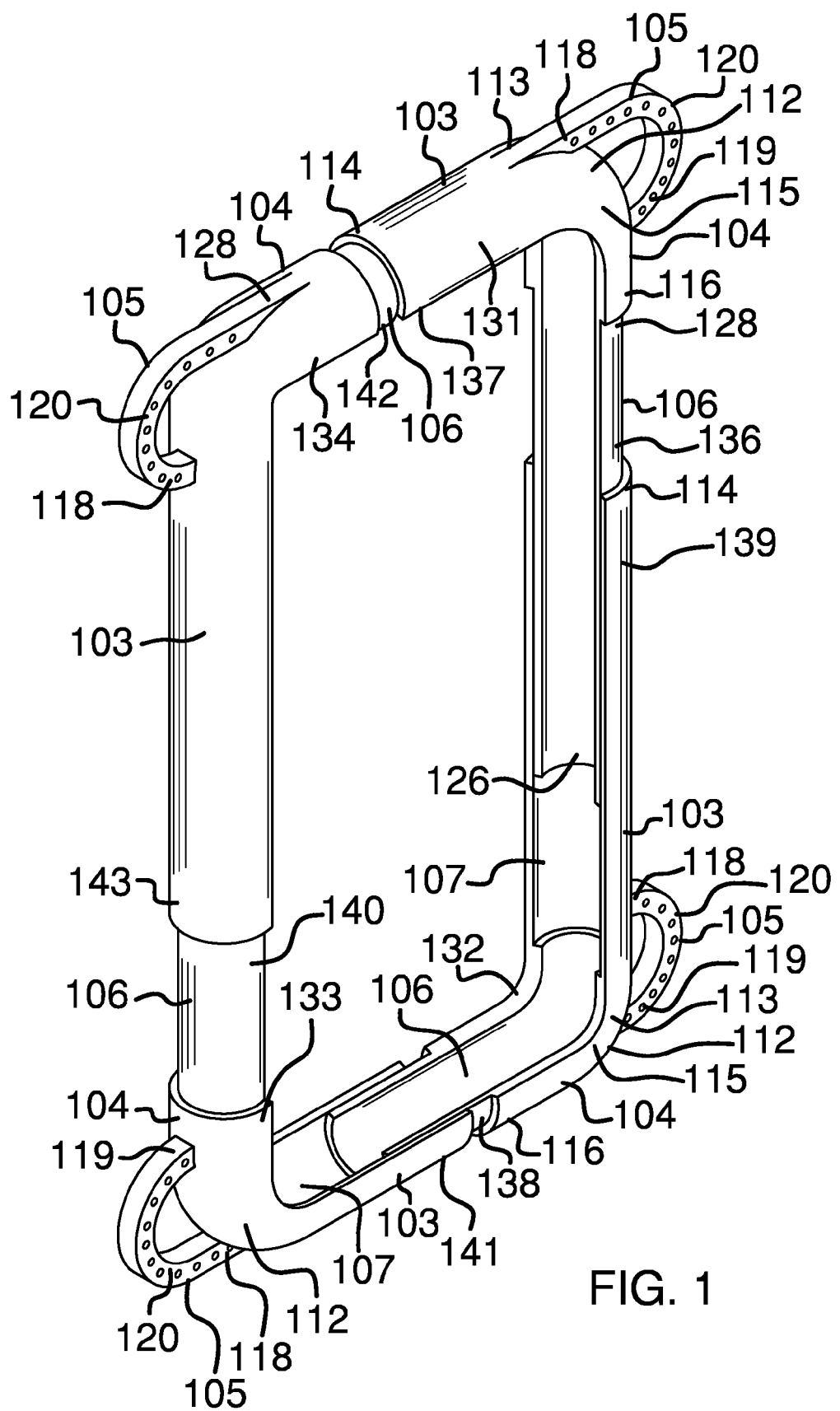
FIG. 1 is a perspective view of an embodiment of the disclosure.
Figure 2:
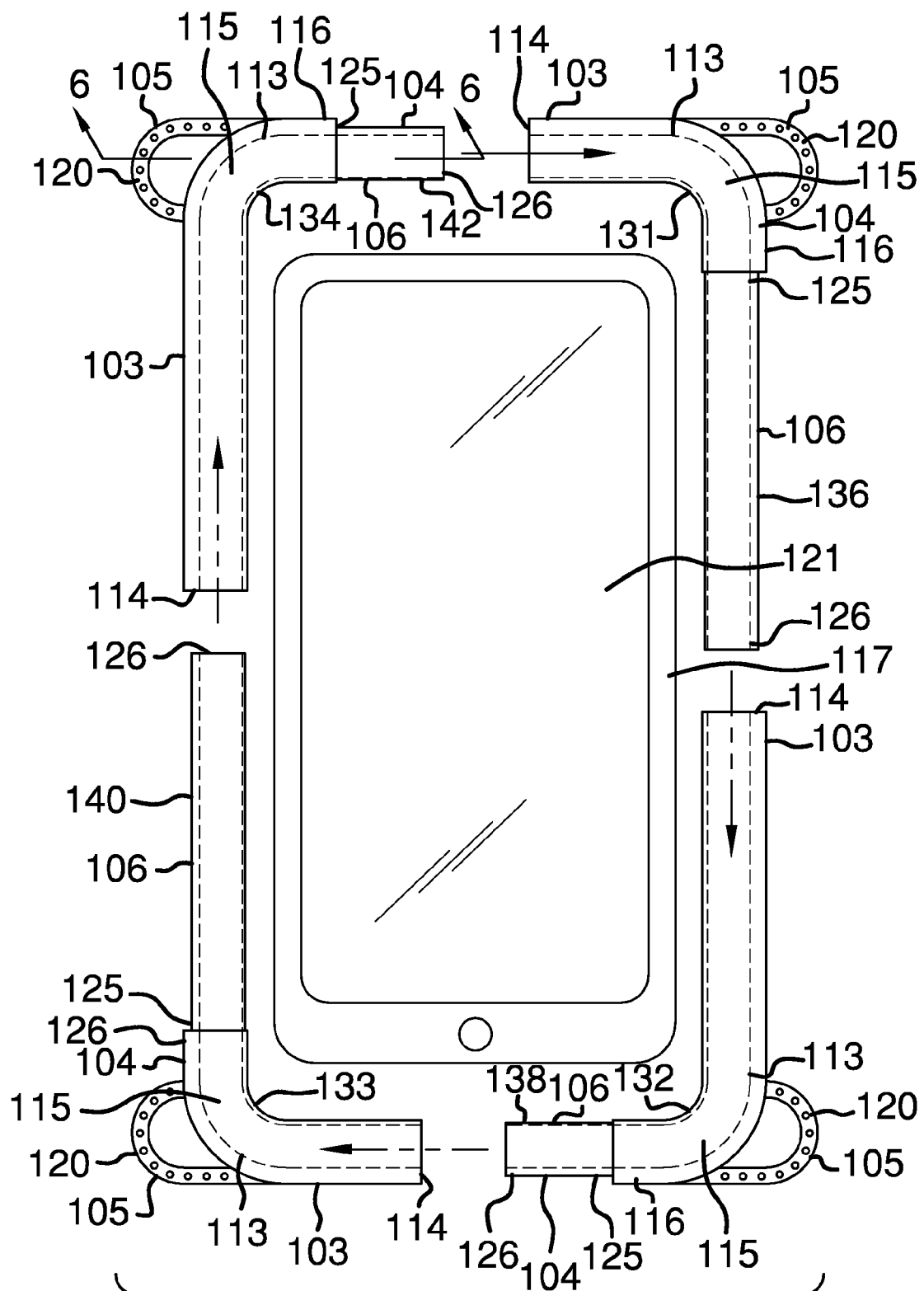
FIG. 2 is a front view of an embodiment of the disclosure.
Figure 3:
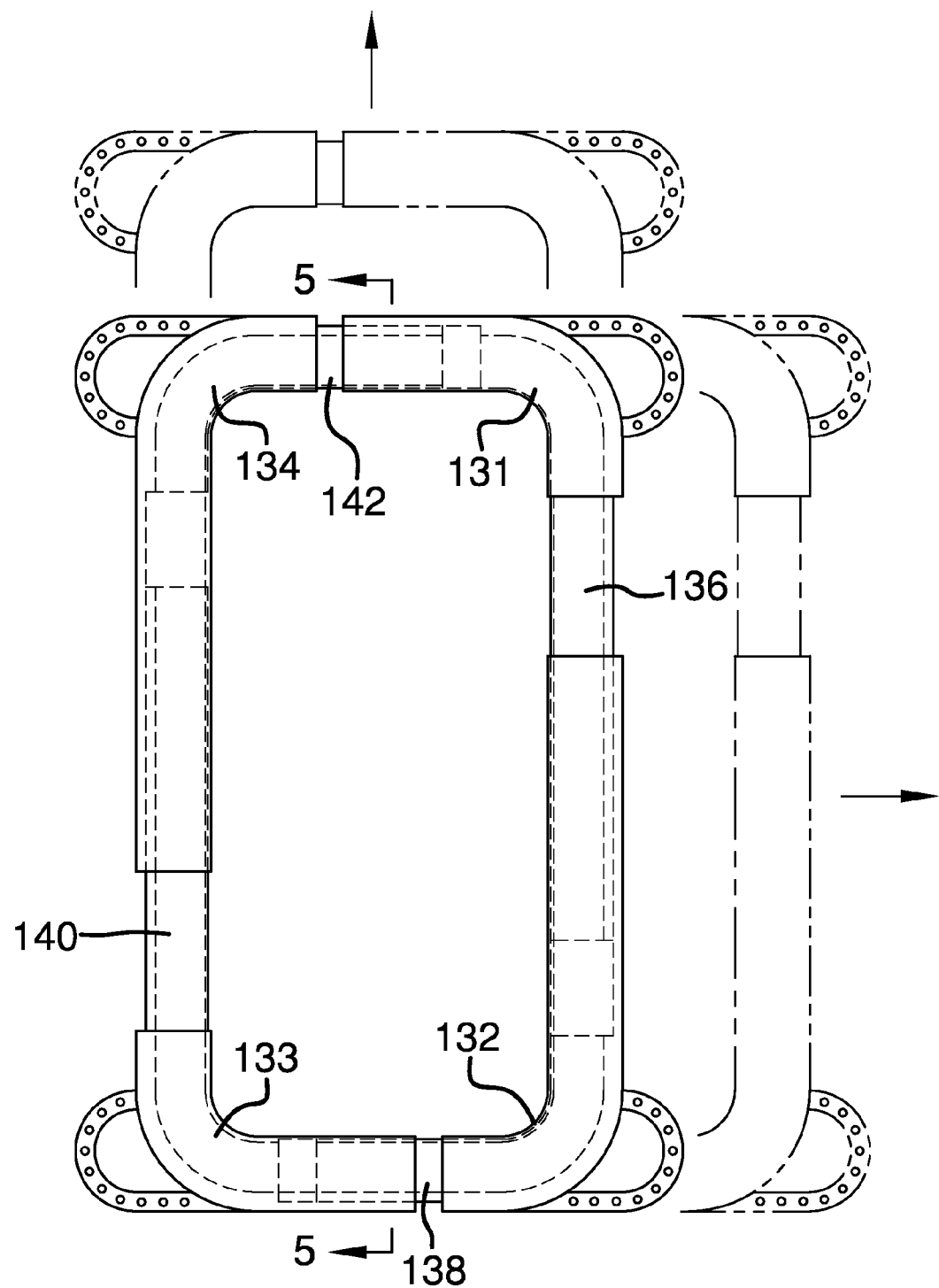
FIG. 3 is an expanded view of an embodiment of the disclosure.
Figure 4:
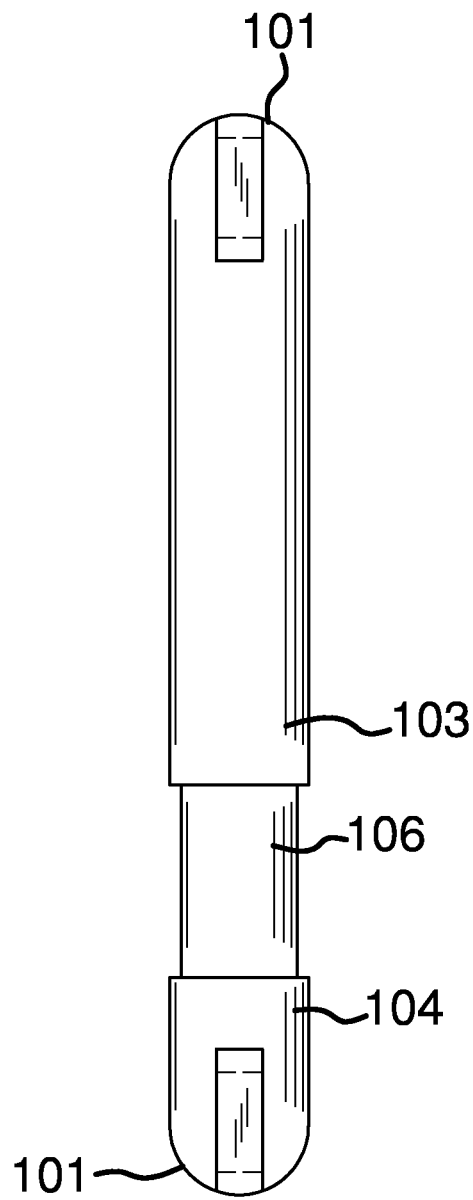
FIG. 4 is a side view of an embodiment of the disclosure.
Figure 5:
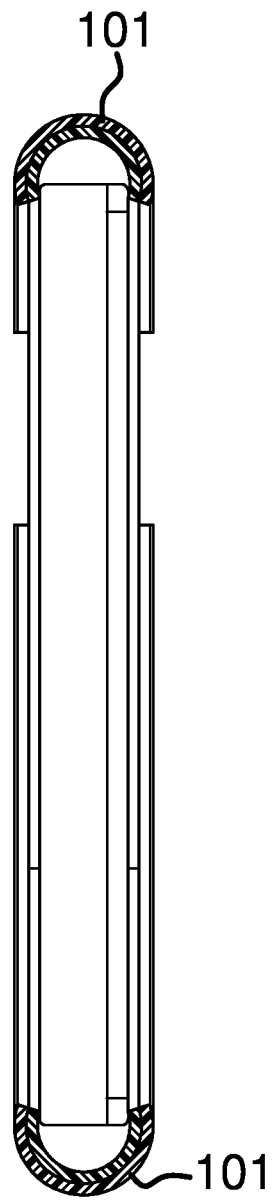
FIG. 5 is a cross-sectional view of an embodiment of the disclosure across line 5-5 in FIG. 3.
Figure 6:
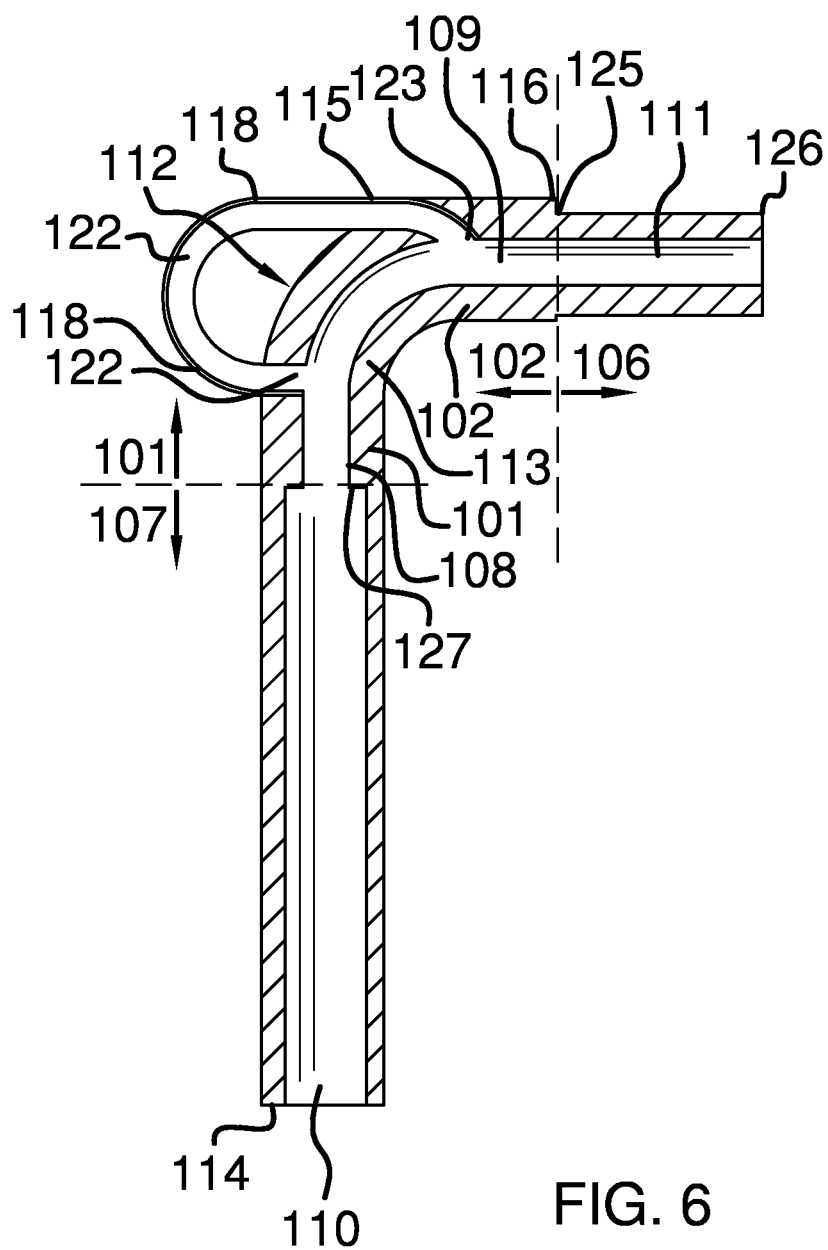
FIG. 6 is a cross-sectional view of an embodiment of the disclosure across line 6-6 in FIG. 2.

Detailed reference will now be made to a first potential embodiment of the disclosure, which is illustrated in FIGS. 1 through 6. The sound amplifying cell case 100 (hereinafter invention) comprises a plurality of corner brackets 101. The plurality of corner brackets 101 further comprises a first corner bracket 131, a second corner bracket 132, a third corner bracket 133 and a fourth corner bracket 134.

Each of the plurality of corner brackets 101 comprises a first leg 103, a second leg 104, a handhold 105, a first male projection 106 and a second female projection 107.

The first leg 103 is in the shape of a bar with a first groove 108 formed in it and is further defined with a first end 113. The second leg 104 is in the shape of a bar with a second groove 109 formed in it, and is further defined with a third end 115 and a fourth end 116. The first end 113 of the first leg 103 and the third end 115 of the second leg 104 are connected at a right angle 112 with a rounded corner. Extending from the fourth end 116 of the second leg 104 is the first male projection 106. The first male projection 106 is in the shape of a bar with a fourth groove 111 formed in it. The size and depth of the first groove 108, the second groove 109, and the fourth groove 111 are identical.

Extending from the second end 114 of the first leg 103 is the second female projection 107. The second female projection 107 is an extension of the first leg 103 and has a third groove 110 formed that is larger than the first groove 108. The second female projection 107 is further defined by a second end 114, which is the end distal from the first end 113. The first male projection 106 is further defined with a seventh end 125, which is joined to the fourth end 116, and an eighth end 126, which is distal from the seventh end 125. The third groove 110 is further defined with a ninth end 127, which is distal from the second end 114.

The exterior circumference of the first leg 103, second leg 104, and second female projection 107 are identical. The exterior circumference of the first male projection 106 is sized to fit into the third groove 110 of the second female projection 107. The size and depth of the first groove 108, the second groove 109, and the fourth groove 111 are identical. The size and depth of the first groove 108, the second groove 109, and the fourth groove 111 are sized to fit around the edge of the cellular phone or tablet 117 with which it is intended to be used.

The handhold 105 is a loop handle that is further defined with a fifth end 118 and a sixth end 119. The fifth end 118 is secured to the first leg 103. The sixth end 119 is secured to the second leg 104. The handhold 105 is a hollow tube with a plurality of holes 120 that are perforated on the screen 121 side of the cellular phone or tablet 117. The fifth end 118 of the handhold 105 is attached so that the inner tube 122 of the handhold 105 has access to the first groove 108 of the first leg 103 located at a first connection 123. The sixth end 119 of the handhold 105 are attached so that the inner tube 122 of the handhold 105 has access to the second groove 109 of the second leg 104 located at the second connection 124. This access allows sounds from the speaker of the cellular phone or tablet 117, which is collected and transported through the first groove 108, second groove 109 and fourth groove 111, to be routed to the handhold 105 and directed in the direction of the user through the plurality of holes 120. Directing the sound in one direction makes the cellular phone or tablet 117 sound louder than it otherwise would.

Each of the plurality of corner brackets 101 can be formed as a single piece from several materials including, but not limited to, plastic, aluminum or nitrile rubber. The first corner bracket 131, the second corner bracket 132, the third corner bracket 133 and the fourth corner bracket 134 are all made of the same material.

Detailed attention is now directed towards the first corner bracket 131 which is further defined with a third male projection 136 and a fourth female projection 137. The span from the first end 113 of the first leg 103 to the second end 114 of the fourth female projection 137 is longer than the span from the third end 115 of the second leg 104 to the fourth end 116 of the second leg 104. The span from the seventh end 125 of the third male projection 136 to the eighth end 126 of the third male projection 136 is longer than the span from the second end 114 of the fourth female projection 137 to the ninth end 127 of the fourth female projection 137.

Detailed attention is now directed towards the second corner bracket 132, which is further defined with a fifth male projection 138 and a sixth female projection 139. The span from the first end 113 of the first leg 103 to the second end 114 of the sixth female projection 139 is longer than the span from the third end 115 of the second leg 104 to the fourth end 116 of the second leg 104. The span from the seventh end 125 of the third male projection 136 to the eighth end 126 of the third male projection 136 is shorter than the span from the second end 114 of the fourth female projection 137 to the ninth end 127 of the fourth female projection 137. The span from the second end 114 of the sixth female projection 139 to the ninth end 127 of the sixth female projection 139 is longer than the span from the seventh end 125 of the third male projection 136 to the eighth end 126 of the third male projection 136.

Detailed attention is now directed towards the third corner bracket 133 which is further defined with a seventh male projection 140 and an eighth female projection 141. The third corner bracket 133 is identical to the first corner bracket 131.

Detailed attention is now directed towards the fourth corner bracket 134 which is further defined with a ninth male projection 142 and a tenth female projection 143. The fourth corner bracket 134 is identical to the second corner bracket 132.

To attach the invention 100 to the cellular phone or tablet 117 being protected, the third male projection 136 is inserted into the sixth female projection 139, the fifth male projection 138 is inserted into the eighth female projection 141, the seventh male projection 140 is inserted into the tenth female projection 143 and the ninth male projection 142 is inserted into the fourth female projection 137. The relative positions of third male projection 136 and the sixth female projection 139, the fifth male projection 138 and the eighth female projection 141, the seventh male projection 140 and the tenth female projection 143, and the ninth male projection 142 and the fourth female projection 137 are adjusted until the grooves are fit into place.

With respect to the above description, it is to be realized that the optimum dimensional relationship for the various components of the invention described above and in FIGS. 1 through 6, include variations in size, materials, shape, form, function, and manner of operation, assembly and use, are deemed readily apparent and obvious to one skilled in the art, and all equivalent relationships to those illustrated in the drawings and described in the specification are intended to be encompassed by the invention.

Is shall be noted that those skilled in the art will readily recognize numerous adaptations and modifications which can be made to the various embodiments of the present invention which will result in an improved invention, yet all of which will fall within the spirit and scope of the present invention as defined in the following claims. Accordingly, the invention is to be limited only by the scope of the following claims and their equivalents.

What is claimed is:

1. A case comprising
a plurality of corner brackets;
wherein the case is adapted for use with cellular phone or tablet;
wherein the case is provided with handholds;
wherein the case is adapted to amplify sound of the cellular phone or the tablet;
wherein the plurality of corner brackets further comprises a first corner bracket, a second corner bracket, a third corner bracket and a fourth corner bracket; wherein each of the plurality of corner brackets comprises a first leg, a second leg, a handhold, a first male projection and a second female projection; and
wherein the handhold is a hollow tube with a plurality of holes that are perforated on the screen side of the cellular phone or tablet and allowing the sound from a speaker of the cellular of tablet to be routed to the handhold through the plurality of holes.

2. The case according to claim 1 wherein the first leg is in the shape of a bar with a first groove formed in it; wherein the first leg is further defined with a first end; wherein the second leg is in the shape of a bar with a
second groove formed in it;
wherein the second leg and is further defined with a third end and a fourth end;
wherein the first end of the first leg and the third end second leg are connected at a right angle with a rounded corner.

3. The case according to claim 2 wherein the first male projection extends from the fourth end of the second leg.

4. The case according to claim 3 wherein the first male projection is in the shape of a bar with a fourth groove formed therein;

wherein the size and depth of the first groove, the second groove, and the fourth groove are identical.

5. The case according to claim 4 wherein the second female projection extends from the first leg.

6. The case according to claim 5 wherein the second female projection is formed with a third groove;
wherein the third groove is larger than the first groove.

7. The case according to claim 6 wherein the second female projection is further defined with a second end;
wherein the third groove is further defined with a ninth end;
wherein the first male projection is further defined with a seventh end and an eighth end;
wherein the seventh end is joined to the fourth end.

8. The case according to claim 7 wherein the exterior circumference of the first leg, second leg, and second female projection are identical;
wherein the exterior circumference of the first male projection is sized to fit into the third groove of the second female projection;
wherein the size and depth of the first groove, the second groove and the fourth groove are sized to fit around the edge of the cellular phone or tablet.

9. The case according to claim 8 wherein the size and depth of the first groove, the second groove and the fourth groove are sized to fit around the edge of the cellular phone or tablet.

10. The case according to claim 9 wherein the handhold is a handle that is further defined with a fifth end and a sixth end;
wherein the fifth end is secured to the first leg; wherein the sixth end is secured to the second leg;
wherein the fifth end of the handhold is attached so that the inner tube of the handhold has access to the first groove of the first leg;
wherein the sixth end of the handhold is attached so that the inner tube of the handhold has access to the second groove of the second leg.

11. The case according to claim 10 wherein each of the plurality of corner brackets is selected from a group consisting of aluminum, plastic and nitrile rubber.

12. The case according to claim 7 wherein
wherein the first corner bracket further comprises a third male projection and a fourth female projection;
wherein the second corner bracket further comprises a fifth male projection and a sixth female projection;
wherein the third corner bracket further comprises a seventh male projection and an eighth female projection;
wherein the fourth corner bracket further comprises a ninth male projection and a tenth female projection.

13. The case according to claim 12 wherein the span from the first end of the first leg to the second end of the fourth female projection is longer than the span from the third end of the second leg to the fourth end of the second leg;
wherein the span from the seventh end of the third male projection to the eighth end of the third male projection is longer than the span from the second end of the fourth female projection to the ninth end of the fourth female projection.

14. The case according to claim 13 wherein the span from the first end of the first leg to the second end of the sixth female projection is longer than the span from the third end of the second leg to the fourth end of the second leg;
wherein the span from the seventh end of the third male projection to the eighth end of the third male projection is shorter than the span from the second end of the fourth female projection to the ninth end of the fourth female projection;
wherein the span from the second end of the sixth female projection to the ninth end of the sixth female projection is longer than the span from the seventh end of the third male projection to the eighth end of the third male projection.

15. The case according to claim 14 wherein the third corner bracket is identical to the first corner bracket;
wherein the fourth corner bracket is identical to the second corner bracket.

16. The case according to claim 14 wherein the first corner bracket further comprises a third male projection and a fourth female projection;
wherein the second corner bracket further comprises a fifth male projection and a sixth female projection;
wherein the third corner bracket further comprises a seventh male projection and an eighth female projection;
wherein the fourth corner bracket further comprises a ninth male projection and a tenth female projection.

17. The case according to claim 16 wherein the third male projection is inserted into the sixth female projection;
wherein the fifth male projection is inserted into the eighth female projection;
wherein the seventh male projection is inserted into the tenth female projection;
wherein the ninth male projection is inserted into the fourth female projection.

* * * * *